United States Patent [19]

Severinsky

[11] Patent Number: 4,956,600
[45] Date of Patent: Sep. 11, 1990

[54] HIGH FREQUENCY CURRENT DETECTOR FOR A LOW FREQUENCY LINE

[75] Inventor: Alex J. Severinsky, Silver Spring, Md.

[73] Assignee: Viteq Corporation, Lanham, Md.

[21] Appl. No.: 214,266

[22] Filed: Jul. 1, 1988

[51] Int. Cl.$^5$ .................. G01R 31/02; G01N 29/04
[52] U.S. Cl. .......................... 324/103 R; 324/103 P; 324/133; 324/127; 324/119
[58] Field of Search ........... 324/119, 111, 127, 103 R, 324/103 P, 133; 307/261, 351; 329/203, 204, 205 R, 206; 363/44

[56] References Cited

U.S. PATENT DOCUMENTS

| | | | |
|---|---|---|---|
| 1,602,882 | 10/1926 | Chubb | 324/119 |
| 2,272,849 | 2/1942 | Perkins | 324/119 |
| 2,603,779 | 7/1952 | Ferrill, Jr. | 324/119 |
| 2,876,411 | 3/1959 | Cann | 307/351 |
| 2,950,438 | 8/1960 | Gilbert | 324/117 |
| 3,039,253 | 6/1962 | Van Hoesen et al. | 55/105 |
| 3,267,350 | 8/1966 | Graham et al. | 321/18 |
| 3,500,195 | 3/1970 | Specht | 324/117 |
| 3,629,622 | 12/1971 | Denenberg | 307/297 |
| 3,629,681 | 12/1971 | Gurwicz | 320/21 X |
| 3,733,540 | 5/1973 | Hawkins | 321/47 X |
| 3,913,002 | 10/1975 | Steigerwald et al. | 321/2 X |
| 3,959,714 | 5/1976 | Mihelich | 323/17 X |
| 4,034,280 | 7/1977 | Cronin et al. | 363/25 X |
| 4,042,871 | 8/1977 | Grubbs et al. | 363/28 X |
| 4,074,344 | 2/1978 | Pitel | 363/44 X |
| 4,240,134 | 12/1980 | Nakazawa et al. | 363/21 X |
| 4,255,699 | 3/1981 | Calvin | 323/322 X |
| 4,302,717 | 11/1981 | Olla | 323/282 X |
| 4,317,979 | 3/1982 | Frank et al. | 219/10.77 |
| 4,340,931 | 7/1982 | Endo et al. | 363/44 X |
| 4,347,560 | 8/1982 | Seiersen | 363/24 X |
| 4,384,321 | 5/1983 | Rippel | 363/124 X |
| 4,385,271 | 5/1983 | Kurtz et al. | 324/133 |
| 4,386,394 | 5/1983 | Kocher et al. | 363/20 X |
| 4,410,848 | 10/1983 | Frierdich | 322/25 X |
| 4,412,277 | 10/1983 | Mitchell | 363/81 X |
| 4,437,146 | 3/1984 | Carpenter | 363/21 X |
| 4,445,166 | 4/1984 | Berglund et al. | 363/48 X |
| 4,472,672 | 9/1984 | Pacholok | 320/21 X |

(List continue on next page.)

FOREIGN PATENT DOCUMENTS 3104965 8/1982 Fed. Rep. of Germany.
540221 2/1977 U.S.S.R..

OTHER PUBLICATIONS

"Unity Power Factor Off Line Switching Power Supplies", Richard Keller and Gary Baker, IEEE 1974, pp. 332-339.

"Low-Distortion Three-Phase Power Regulator", W. P. Marple, IBM Technical Disclosure Bulletin, vol. 22, No. 3, Aug. 1979.

"A New High Current Converter Configuration Dramatically Reduces Switching Transistor Stress", Avi Berstein, Proceedings of Powercon 11, pp. 1-7; (4/10-12/84).

*Primary Examiner*—Reinhard J. Eisenzopf
*Assistant Examiner*—Vinh P. Nguyen
*Attorney, Agent, or Firm*—Banner, Birch, McKie & Beckett

[57] ABSTRACT

A line isolated current detector for detecting low frequency peak to peak currents on a high frequency chopped line with a first series diode and resistor detecting positive waves and a second series diode and resistor detecting negative waves. First and second capacitors across the first and second resistors, respectively, temporarily store positive and negative detected waves. A third series diode and resistor connected in parallel across the first series diode and resistor and a fourth series diode and resistor connected in parallel across the second series diode and resistor allows faster charging and slower discharging of the capacitors. This allows the capacitors to charge waveforms quick enough to use a high frequency current transformer sensing a high frequency chopped line and discharge waveform slow enough to reconstruct the low frequency waveform before high frequency chopping to allow accurate current measurements of direct current or low frequency currents using a current transformer.

13 Claims, 4 Drawing Sheets

U.S. PATENT DOCUMENTS

| | | | |
|---|---|---|---|
| 4,480,201 | 10/1984 | Jaeschke | 307/570 X |
| 4,500,797 | 2/1985 | Nishimoto | 307/296 R X |
| 4,540,893 | 9/1985 | Bloomer | 307/248 X |
| 4,591,963 | 5/1986 | Retotar | 363/17 X |
| 4,594,501 | 6/1986 | Culley et al. | 219/492 X |
| 4,618,812 | 10/1986 | Kawakami | 323/224 X |
| 4,620,444 | 11/1986 | Young | 324/103 P |
| 4,649,302 | 3/1987 | Damiano et al. | 307/584 X |
| 4,675,799 | 6/1987 | Suzuki et al. | 363/58 X |
| 4,675,800 | 6/1987 | Seki et al. | 363/58 X |
| 4,675,802 | 6/1987 | Sugimoto | 363/68 X |
| 4,677,366 | 6/1987 | Wilkinson et al. | 363/164 X |
| 4,677,535 | 6/1987 | Kawabata et al. | 363/65 X |
| 4,677,536 | 6/1987 | Pepper | 363/89 X |
| 4,677,537 | 6/1987 | Chonan | 363/126 |
| 4,680,689 | 7/1987 | Payne et al. | 363/26 X |
| 4,680,692 | 7/1987 | Sakai | 363/35 X |
| 4,688,162 | 8/1987 | Mutch et al. | 363/80 X |
| 4,712,169 | 12/1987 | Albach | 363/89 X |
| 4,719,552 | 1/1988 | Albach et al. | 363/44 X |
| 4,763,237 | 8/1988 | Wieczorek | 363/20 X |

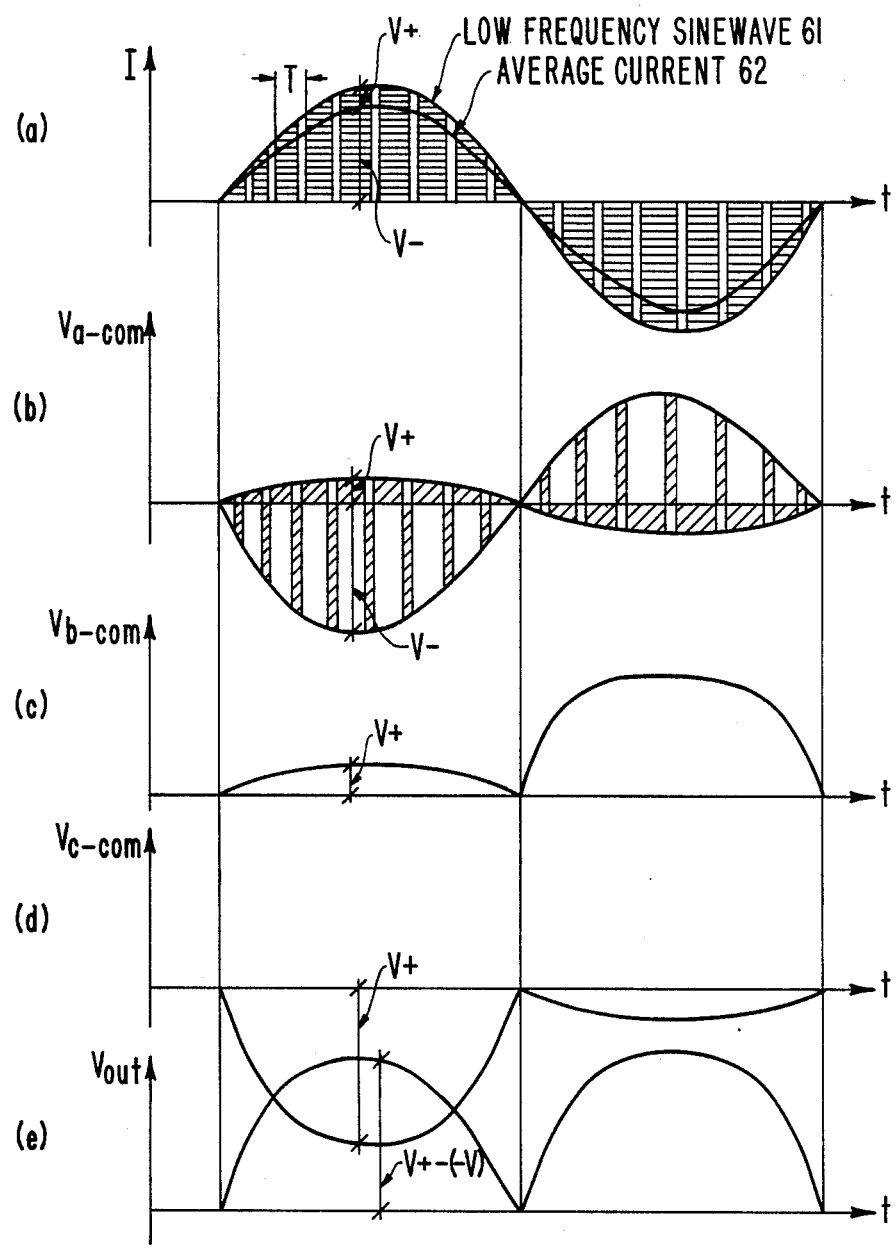

HIGH FREQUENCY CURRENT DETECTOR FOR A LOW FREQUENCY LINE

BACKGROUND OF THE INVENTION

1. Technical Field

The present invention generally relates to the field of current detection and more particularly, is directed to a circuit for measuring direct current or slowly changing currents utilizing a current transformer.

2. Related Art

As known in the prior art, direct current, or slowly changing currents, can be measured by measuring the corresponding voltage drop across a resistive shunt. A problem with resistive shunts, however, is that they dissipate power. For example, a 100 millivolts drop across a 50 amp shunt will dissipate 5 Watts. Furthermore, in an electrically noisy environment, the usually small voltages which are produced by a resistive shunt are too small to be reliably measured. Commonly available shunts typically generate 50-100 millivolts which yield unreliable results in the noisy environment of electronic power converter. Shunts also can require complex and expensive isolation amplifiers to convert the shut voltage to a value for input to a control circuit.

Conventionally, direct current and slowly changing currents can also be measured using Hall-effect detectors. Hall-effect detectors are expensive and have very low sensitivity in the 10 milivolt range. Having low sensitivity, Hall-effect detectors require shielded amplifiers for reliable detection in a noisy environment. In a noisy environment (such as that of a power converter), Hall-effect detectors have been found to be expensive.

Prior to this invention, the use of current transformers to measure direct current or slowly changing currents was not practical. Using current transformers to measure current on a line required an alternating field to couple the current in the line to the current transformer. Direct current or slowly changing currents alone did not have a sufficient alternating field to couple to a current transformer. Low frequency, alternating current, for example 50-60 Hertz, could be coupled to a current transformer if a low frequency current transformer was used. However, low frequency transformers were large and expensive.

The present invention allows for the use of smaller and more economical high frequency current transformers instead of the large and expensive low frequency current transformers. It has been found in the present invention that chopping direct current or low frequency current into high frequency segments can be performed to couple the direct or low frequency current to a high frequency current transformer. It has also been found in the present invention that some circuits (such as those in power converters) inherently chop direct and low frequency currents such that chopping per se will not need to be implemented.

A problem with measuring chopped direct or low frequency currents is that the measured signal must be reconstructed or "unchopped" to its original direct or low frequency state. The present invention provides current detector circuits for reconstructing a signal to its original unchopped state faster, more economically and more precisely than heretofore possible.

SUMMARY OF THE INVENTION

These and other objects of the present invention are achieved by a current detector which is capable of measuring direct current or low frequency currents using a small, low cost high frequency current transformer. The high frequency current transformer senses low frequency currents chopped into high frequency currents. A first series diode and resistor detects positive waves and a second series diode and resistor detects negative waves. A first and second capacitor across the first and second resistors, respectively, temporarily stores the positive and negative detected waves. The output of the current detector, taken across the first and second capacitors in series, allows for peak to peak output of the measured current and is produced by the adding of the positive peak and negative peak detected waves stored in the capcitors.

The RC time constant of the capacitor/resistor pairs determine the decay rate of the stored waveform. A slower RC time constant allows the capacitors to store the detected waves for a longer period of time thereby enabling smoother and more accurate peak to peak measurements. However, a faster RC time constant is desired for quicker charging of the capacitor storage circuits. Faster charging and slower discharging of the capacitors is possible by providing a second diode and resistor in series at both the positive and negative wave detection circuit inputs. This allows the RC time constant to include two resistors for charging and one resistor for discharging. In this arrangement, the capacitor storage circuits can charge quick enough to store currents sensed using a high frequency current transformer on a high frequency chopped line and discharge the stored detected currents slowly enough so that smoother, more accurate peak to peak measurements can be made of low frequency currents on a high frequency chopped line.

An object of this invention is to provide a current detector capable of measuring low frequency currents on a high frequency chopped line.

A further object of this invention is to provide a current detector capable of measuring direct current or low frequency currents using a small, light-weight and inexpensive high frequency current transformer.

A further object of this invention is to provide a current detector capable of measuring peak to peak currents more accurately and with a faster response time.

Another object of this invention is to provide a current detector for use in power converters to measure internal currents inherently chopped by the existing power converter circuitry.

The above-mentioned and other objects and features of the present invention will become apparent from the following description read in conjunction with the accompanying drawings.

BRIEF DESCRIPTION OF THE DRAWINGS

FIGS. 5(a)–5(e) are waveform diagrams illustrating the operation of the circuits of FIGS. 1–3.

DETAILED DESCRIPTION OF THE INVENTION

Figure 1:
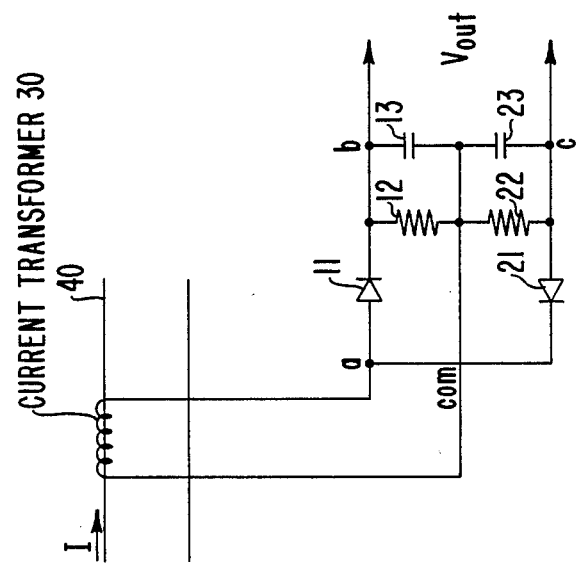
FIG. 1 is a schematic diagram of the basic circuitry for measuring positive and negative peak to peak currents with a current transformer.

FIG. 1 shows a schematic diagram of the basic current detector circuitry of the invention. Current I in line 40 is detected by current transformer 30. The $V_{a\text{-}com}$ output from current transformer 30 between points a and com is proportional to the current I in line 40. Diodes 11 and 21 serve as a full-wave rectifier with a common point connection com. Diode 11 detects positive voltages at $V_{a\text{-}com}$ to produce a positive waveform $V_{b\text{-}com}$ across load resistor 12 and capacitor 13. Likewise, diode 21 detects negative voltages at $V_{a\text{-}com}$ to produce a negative waveform $V_{c\text{-}com}$ across load resistor 22 and capacitor 23. The output $V_{out}$ of the current detector is taken across capacitors 13 and 23 to yield $V_{bc}$ which is $V_{c\text{-}com}$ subtracted from $V_{b\text{-}com}$.

Resistors 12 and 22 not only serve as a load for current transformer 30 but they also form RC pairs with capacitors 13 and 23, respectively. These capacitor pairs have a time constant RC for storing the detected positive and negative waveforms, respectively. The RC time constant of the capacitor resistor pairs 12, 13 and 22, 23 determines the decay rate of the waveform stored in capacitors 13 and 23. A slower RC time constant allows capacitors 13 and 23 to store the detected waveforms for a longer period of time thereby enabling smoother and more accurate peak to peak measurements. However, the RC time constant must have a fast enough charge rate to store the measured current at the rate of the chopper. It is difficult to find an RC time constant sufficient to both store the detected wave for a period of time long enough to accurately smooth the chopped wave and also have a short enough period of time to charge at the rate of chopping.

Figure 2:
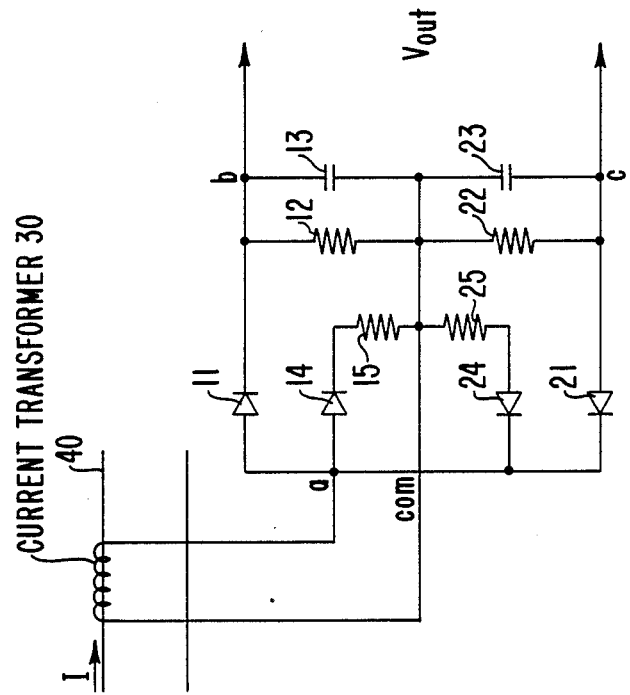
FIG. 2 is a schematic diagram of the circuitry of the preferred embodiment for measuring positive and negative peak to peak currents with a current transformer having a fast charge rate and a slow discharge rate.

FIG. 2 shows a schematic diagram of the preferred embodiment of the invention having a second series diodes 14 and 24 and resistors 15 and 25, respectively, in parallel with diodes 11 and 21 and resistors 12 and 22, respectively. The second diode and resistor in series at both the positive and negative wave detection circuits allows faster charging and slower discharging of capacitors 13 and 23. This is accomplished, for example, by the RC time constant for the positive wave detector made up of two resistors 15 and 12 for charging and one resistor 12 for discharging. In this arrangement, capacitor 13 has a time constant quick enough to charge at the chopping rate, and capacitor 13 can discharge with a second time constant long enough to more accurately reconstruct the wave by smoothing it over a longer time period. The voltage amplitude on resistor 12, for example, is the same as the voltage on resistor 15 since the voltage drops on both diodes 11 and 14 are practically the same. The same is true for resistors 22 and 25 and diodes 24 and 21 on the negative half of the detector. Resistors 12 and 22 preferably are several orders of magnitude larger than resistors 15 and 25 serving as a load for current transformer 30. This allows use of small capacitors 13 and 23 acting as rectifier filtered capacitors at the chopping frequency. Small capacitors will not distort the frequency characteristic of current transformer 30 and allow fast time response to be achieved preferably below 1 mksec.

Figure 3:
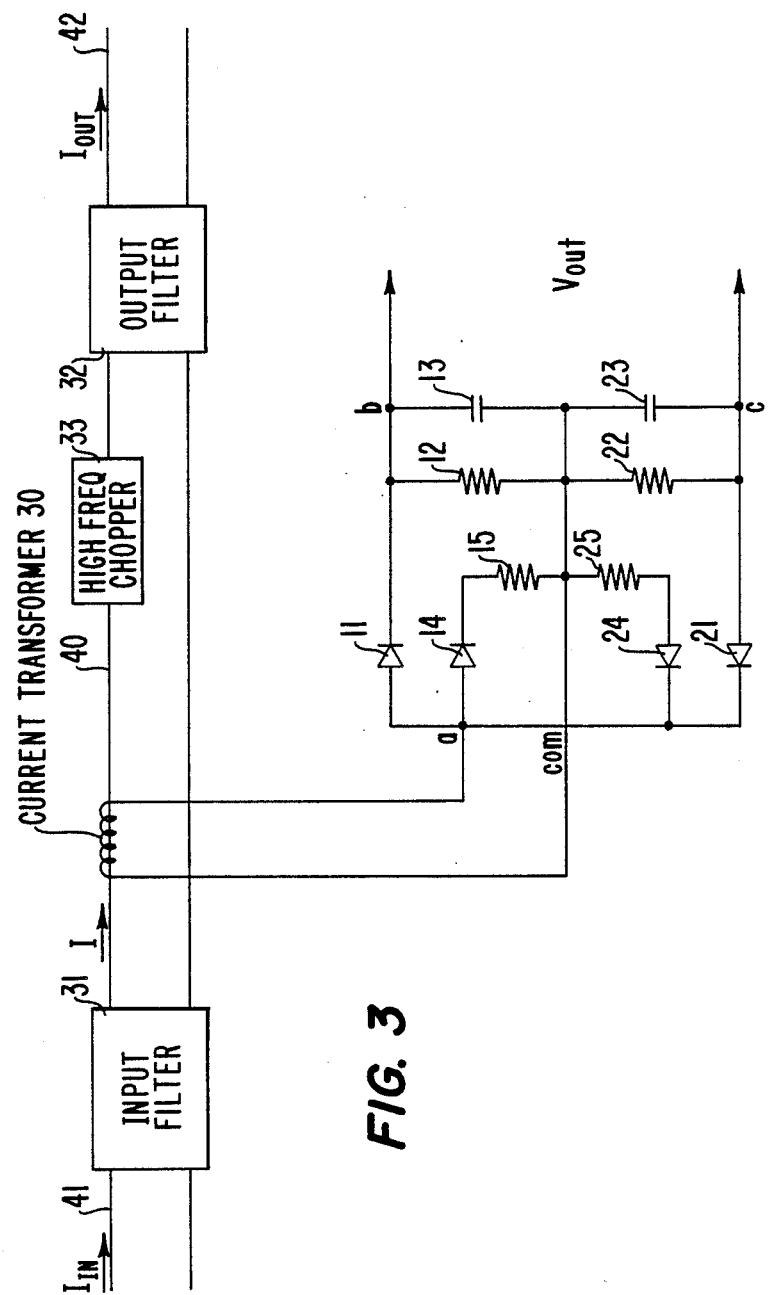
FIG. 3 is a schematic diagram of a circuit for measuring positive and negative peak to peak currents using a current transformer on a line provided with input and output filters and a high frequency chopper.

FIG. 3 shows a schematic diagram of the preferred current detector circuitry using current transformer 30 on line 40 provided with input filter 31, output filter 32 and high frequency chopper 33. A high frequency chopper, or alternatively high frequency chopped signals, may be inherently present on a line to be measured. Such is the case in many power converters where direct current and slowly changing low frequency currents are present on lines as a chopped high frequency signal. FIG. 3 shows an embodiment where a high frequency chopping circuit 33 is specifically used. A chopping rate in the Kilohertz range can be used, however other chopping rates are possible depending on the RC values of available detector components. Input filter 31 smoothes input current $I_{in}$ and output filter 32 smoothes output current $I_{out}$ so that the current before input 41 or after output 42 is not affected by the high frequency chopping of chopper 33.

Figures 4A, 4B, 4C:
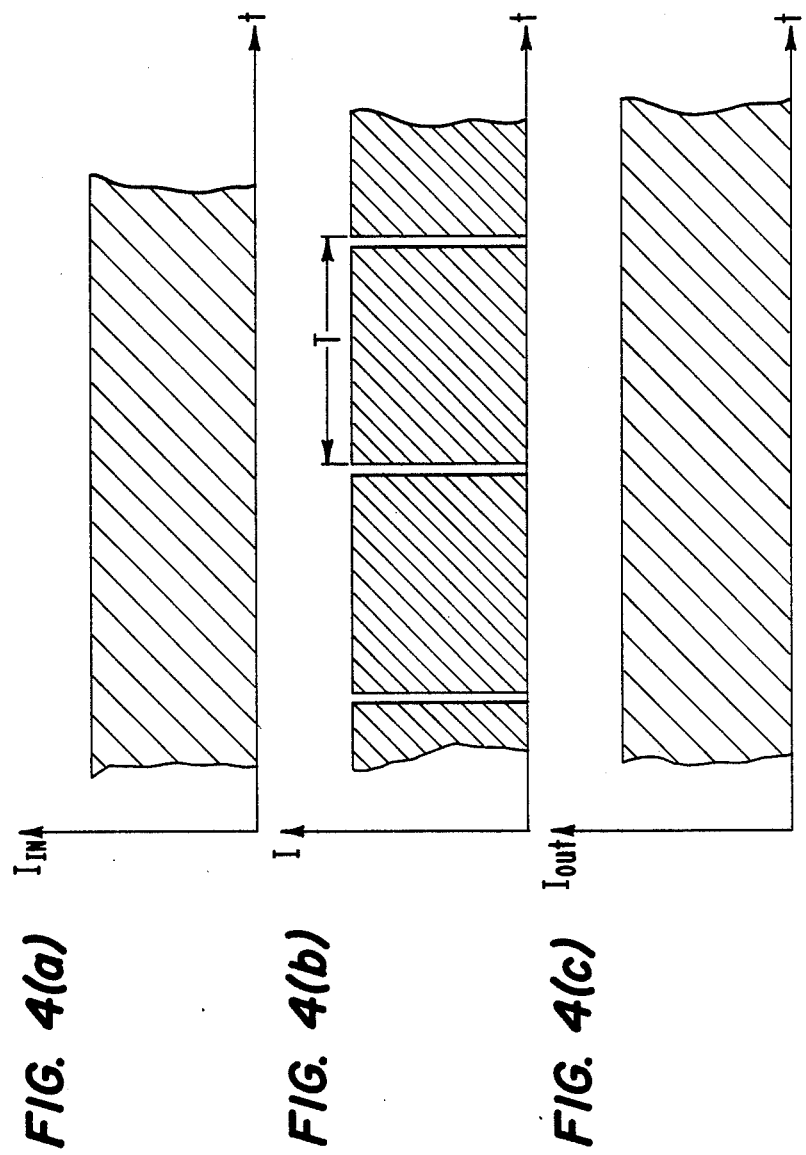
FIGS. 4(a)–4(c) are waveform diagrams illustrating the chopped and filtered currents in FIG. 3.

FIGS. 4(a)–4(c) are waveform diagrams illustrating the chopped and filtered currents in FIG. 3. FIG. 4(a) shows input current $I_{in}$. FIG. 4(b) shows current I on line 40 chopped by chopper 33 having a chopping rate of period T. FIG. 4(c) shows output current $I_{out}$. It can be seen in FIGS. 4(a) and 4(c) that the input and output currents $I_{in}$ and $I_{out}$ are filtered by filters 31 and 32 so that current on lines 41 and 42 is not affected by the chopping of current I on line 40 by chopper 33.

FIGS. 5(a)–5(e) are waveform diagrams illustrating the operation of the circuits previously described and illustrated in FIGS. 1–3. FIG. 5(a) shows current I on line 40. Current I on line 40 is chopped at chopping rate T. Current I is illustrated as a low frequency sinewave 61 with a high frequency chopping superimposed thereon. Because of the high frequency chopping, current I on line 40 will have an average current 62 slightly lower than the peak current value. For example, the chopped low frequency sinewave has a lower average current amplitude as illustrated by average current value 62 in FIG. 5(a).

FIG. 5(b) illustrates voltage $V_{a\text{-}com}$ output of current transformer 30 indicative of current I in FIG. 5(a). Because current transformer 30 only detects changes in current, the waveform of FIG. 5(b) has its horizontal axis riding upon the average current 62 of current waveform I.

FIG. 5(c) shows positive waveform $V_{b\text{-}com}$ across capacitor 13 depicting the positive waveform detected by diodes 11 and 14. Only the positive portion $V_+$ for waveform $V_{a\text{-}com}$ is illustrated in FIG. 5(c) as $V_{b\text{-}com}$. Likewise, FIG. 5(d) shows negative waveform $V_{c\text{-}com}$ across capacitor 23 depicting the negative waveform detected by diodes 21 and 24. Only the negative portion $V_-$ for waveform $V_{a\text{-}com}$ is illustrated in FIG. 5(d) as $V_{c\text{-}com}$.

FIG. 5(e) shows the output voltage $V_{out}$ of the current detector measured differentially between capacitors 13 and 23. $V_{out}$ across capacitors 13 and 23 yields $V_{bc}$ which is $V_{c\text{-}com}$ subtracted from $V_{b\text{-}com}$. $V_-$ can be seen inverted and substracted from $V_+$ in the waveform diagram of FIG. 5(e). The amplitude of the output voltage $V_{out}$ is thus illustrated reconstructed with an amplitude proportional to the amplitude of the original low frequency sinewave 61 without regard to polarity.

While the invention has been illustrated and described in detail in the drawings and foregoing description, it will be recognized that changes and modifications will occur to those skilled in the art. It is therefore intended, by the appended claims, to cover any such changes and modifications as fall within the true spirit and scope of the invention.

What is claimed is:

1. A line isolated current detector for detecting a low frequency peak to peak current on a high frequency chopped line comprising:
   sensing means for providing positive and negative waves;
   first means for detecting positive waves output of the sensing means;
   means for loading said first means for detecing positive waves;
   first means for detecting the negative waves output of the sensing means;
   means for loading said first means for detecting negative waves;
   means for storing positive waves detected by the first means for detecting positive waves;
   means for storing negative waves detected by the first means for detecting negative waves, the means for storing positive waves and the means for storing negative waves configured such that the stored positive and negative waves add;
   second means for detecting positive waves output of the sensing means;
   means for loading said second means for detecting positive waves;
   second means for detecting the negative waves output of the sensing means; and
   means for loading said second means for detecting negative waves.

2. The current detector of claim 1 wherein the means for loading said first means for detecting positive waves and the means for loading said first means for detecting negative waves has a resistance greater than the means for loading said second means for detecting positive waves and the means for loading said second means for detecting negative waves.

3. The current detector of claim 2 further comprising:
   a line sensed by said sensing means to provide said positive and negative waves; and means, provided on said line, for chopping low frequency current at a high frequency.

4. The current detector of claim 3 further comprising input and output filters for smoothing the signal before and after an input and output of the high frequency line so that devices before or after the input and output of the high frequency line are not affected by the high frequency chopping of the means for chopping.

5. The current detector of claim 1 further comprising:
   a line sensed by said sensing means to provide said positive and negative waves; and means, provided on said line, for chopping low frequency current at a high frequency.

6. The current detector of claim 5 further comprising input and output filters for smoothing the signal before and after an input and output of the high frequency line so that devices before or after the input and output of the high frequency line are not affected by the high frequency chopping of the means for chopping.

7. The current detector of claim 5, the sensing means being a high frequency current transformer, the means for detecting being semiconductor diode means, the means for loading being resistive means, and the means for storing being capacitive means.

8. The current detector of claim 1, the sensing means being a high frequency current transformer, the means for detecting being semiconductor diode means, the means for loading being resistive means, and the means for storing being capacitive means.

9. A line isolated current detector for detecting low frequency peak to peak currents on a high frequency chopped line comprising:
   sensing means for providing positive and negative waves;
   first means for detecting positive waves output of the sensing means;
   means for loading said first means for detecting positive waves;
   first means for detecting negative waves output of the sensing means;
   means for loading said first means for detecting negative waves;
   means for storing positive waves detected by the first means for detecting positive waves;
   means for storing negative waves detected by the first means for detecting negative waves, the means for storing positive waves and the means for storing negative waves configured such that the stored positive and negative waves add; and
   a line sensed by said sensing means to provide said positive and negative waves; and means, provided on said line, for chopping low frequency current at a high frequency.

10. A line isolated current detector for detecting low frequency peak to peak currents on a high frequency chopped line comprising:
    sensing means for providing positive and negative waves;
    first means for detecting positive waves output of the sensing means;
    means for loading said first means for detecting positive waves;
    first means for detecting negative waves output of the sensing means;
    means for loading said first means for detecting negative waves;
    means for storing positive waves detected by the first means for detecting positive waves;
    wherein the means for loading said first means for detecting positive waves and the means for storing positive waves as well as the means for loading said first means for detecting negative waves and the means for storing negative waves have time constants capable of detecting low frequency currents in a high frequency line;
    means for storing negative waves detected by the first means for detecting negative waves, the means for storing positive waves and the means for storing negative waves configured such that the stored positive and negative waves add; and
    a line sensed by said sensing means to provide said positive and negative waves; and means, provided on said line, for chopping low frequency current at a high frequency.

11. The current detector of claim 10 further comprising input and output filters for smoothing the signal before and after an input and output of the high frequency line so that devices before or after the input and output of the high frequency line are not affected by the high frequency chopping of the means for chopping.

12. A line isolated current detector for detecting low frequency peak to peak currents on a high frequency chopped line comprising:
    sensing means for providing positive and negative waves;

first means for detecting positive waves output of the sensing means;

means for loading said first means for detecting positive waves;

first means for detecting negative waves output of the sensing means;

means for loading said first means for detecting negative waves;

means for storing positive waves detected by the first means for detecting positive waves;

means for storing negative waves detected by the first means for detecting negative waves, the means for storing positive waves and the means for storing negative waves configured such that the stored positive and negative waves add;

a line sensed by said sensing means to provide said positive and negative waves; and means, provided on said line, for chopping low frequency current at a high frequency; and input and output filters for smoothing the signal before and after an input and output of the high frequency line so that devices before or after the input and output of the high frequency line are not affected by the high frequency chopping of the means for chopping.

13. A line isolated current detector for detecting low frequency peak to peak currents on a high frequency chopped line comprising:

a high frequency current transformer for sensing both low frequency and high frequency currents in a high frequency line;

a first positive wave detector with an input connected to a first output of the current transformer;

a first load connected between an output of the first positive wave detector and a second output of the current transformer;

a first negative wave detector with an input connected to a first output of the current transformer;

a second load connected between an output of the first negative wave detector and a second output of the current transformer;

a positive wave memory for storing a positive wave detected by the positive wave detector, the positive wave memory connected across the first load;

a negative wave memory for storing a negative wave detected by the negative wave detector, the negative wave memory connected across the second load;

an output connected across outputs of the first positive wave detector and the second positive wave detector so that the values stored in the positive and negative wave memories will add to allow a peak to peak measurement;

a second positive wave detector with an input connected to a first output of the current transformer;

a third load connected between an output of the second positive wave detector and a second output of the current transformer;

a fourth negative wave detector with an input connected to a first output of the current transformer; and a fifth load connected between an output of the second negative wave detector and a second output of the current transformer.

* * * * *